United States Patent
Kim et al.

(10) Patent No.: US 11,605,878 B2
(45) Date of Patent: Mar. 14, 2023

(54) ELECTRONIC DEVICE COMPRISING ANTENNA

(71) Applicant: Samsung Electronics Co., Ltd., Gyeonggi-do (KR)

(72) Inventors: Jeonghoon Kim, Gyeonggi-do (KR); Sewoong Kim, Gyeonggi-do (KR); Woosuk Kang, Gyeonggi-do (KR); Museok Bang, Gyeonggi-do (KR); Chaeup Yoo, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 156 days.

(21) Appl. No.: 17/270,507

(22) PCT Filed: Aug. 21, 2019

(86) PCT No.: PCT/KR2019/010643
§ 371 (c)(1),
(2) Date: Feb. 23, 2021

(87) PCT Pub. No.: WO2020/040543
PCT Pub. Date: Feb. 27, 2020

(65) Prior Publication Data
US 2021/0336327 A1 Oct. 28, 2021

(30) Foreign Application Priority Data
Aug. 23, 2018 (KR) .................. 10-2018-0098897

(51) Int. Cl.
*H05K 7/14* (2006.01)
*H01Q 1/24* (2006.01)
(Continued)

(52) U.S. Cl.
CPC ............ *H01Q 1/24* (2013.01); *H05K 5/0017* (2013.01); *H05K 7/1427* (2013.01); *H04B 1/0064* (2013.01)

(58) Field of Classification Search
CPC combination set(s) only.
See application file for complete search history.

(56) References Cited

U.S. PATENT DOCUMENTS

2015/0303551 A1  10/2015  Su et al.
2017/0045916 A1   2/2017  Kim et al.
(Continued)

FOREIGN PATENT DOCUMENTS

JP    2008-66838 A       3/2008
KR    10-2017-0020139 A  2/2017
(Continued)

*Primary Examiner* — Hung S. Bui
(74) *Attorney, Agent, or Firm* — Cha & Reiter, LLC

(57) ABSTRACT

According to various embodiments of the present invention, an electronic device may comprise: a housing comprising a first surface, a second surface oriented in the direction opposite from the first surface, and a side surface surrounding a space between the first surface and the second surface; a conductive member for forming at least a portion of the side surface; a display seen through the first surface and including a first conductive layer; a printed circuit board disposed to be spaced apart from the display between the display and the second surface in the housing, and including a second conductive layer in which at least a portion thereof faces the first conductive layer; a third conductive layer spaced apart from the display and the printed circuit board, disposed between the first conductive layer and the second conductive layer, and facing the first conductive layer; a support structure comprising a non-conductive plate which is formed between the third conductive layer and the printed circuit board and in which at least a portion thereof is in contact with the third conductive layer; a conductive pattern (Continued)

extending between the third conductive layer and the non-conductive plate and electrically connected to the second conductive layer; and a wireless communication circuit electrically connected to the conductive member and configured to transmit and/or receive an RF signal. Other various embodiments may be possible.

15 Claims, 23 Drawing Sheets

(51) Int. Cl.
  *H05K 5/00* (2006.01)
  *H04B 1/00* (2006.01)

(56) References Cited

U.S. PATENT DOCUMENTS

| 2017/0047639 | A1* | 2/2017 | Lee | H01Q 1/243 |
| 2017/0133752 | A1 | 5/2017 | Choi et al. | |
| 2017/0207516 | A1 | 7/2017 | Koo et al. | |

FOREIGN PATENT DOCUMENTS

| KR | 10-2017-0053385 A | 5/2017 |
| KR | 10-2017-0087334 A | 7/2017 |
| KR | 10-1857388 B1 | 5/2018 |

\* cited by examiner

ELECTRONIC DEVICE COMPRISING ANTENNA

CROSS REFERENCE TO RELATED APPLICATIONS

This application is a National Phase Entry of PCT International Application No. PCT/KR2019/010643, which was filed on Aug. 21, 2019, and claims a priority to Korean Patent Application No. 10-2018-0098897, which was filed on Aug. 23, 2018, the contents of which are incorporated herein by reference.

TECHNICAL FIELD

Various embodiments of the disclosure relate to an electronic device including an antenna.

BACKGROUND ART

An electronic device typically has a convergence function of complexly performing one or more functions, and includes antennas for supporting various frequency bands to perform various functions.

Electronic devices are becoming slimmer and efforts to increase structural stiffness of electronic devices and to reinforce exterior design aspects are ongoing. To follow such trends, stiffness is increased by replacing components (for example, a housing) of electronic devices with metal materials, and electronic devices are upgraded in their quality and exterior design.

DISCLOSURE OF INVENTION

Technical Problem

As electronic devices are becoming slimmer to raise consumers' purchasing desire, and metal is more frequently used, a separation distance between an antenna and a metal part and a metal instrument becomes shorter and thus it may be difficult to guarantee enough performance with related-art antenna technology.

For example, a wearable electronic device worn on a human body may include at least one antenna operating in at least one frequency band, and respective antennas should be spaced apart from one another by a predetermined distance or more by considering frequency characteristics. To this end, the size of the device should increase or arrangements of electric materials on a substrate become complicated, and as a result, a circuit loss may occur.

An electronic device may have a wireless communication circuit and a metal housing (for example, a bezel, etc.) electrically connected with each other and may use them as an antenna, so that an antenna mounting space can be guaranteed.

However, since an electronic device using an external metal housing as an antenna, for example, a wearable electronic device, mostly operates while being worn on a human body, performance may be degraded by the human body when the external metal housing is used as an antenna.

Various embodiments of the disclosure may provide an electronic device which has antenna performance enhanced in a low band.

Various embodiments of the disclosure may provide an electronic device which can tune an operating frequency in a low band by using an electric coupling operation between a conductive plate and a conductive pattern.

Solution to Problem

Various embodiments of the disclosure, an electronic device includes: a housing including a first surface, a second surface facing in the opposite direction of the first surface, and a side surface surrounding a space between the first surface and the second surface; a conductive member forming at least a portion of the side surface; a display seen through the first surface and including a first conductive layer; a printed circuit board disposed to be spaced apart from the display between the display and the second surface within the housing, the printed circuit board including a second conductive layer facing the first conductive layer at least in part; a third conductive layer spaced apart from the display and the printed circuit board, disposed between the first conductive layer and the second conductive layer, and facing the first conductive layer; a support structure contacting the third conductive layer at least in part, and including a non-conductive plate formed between the third conductive layer and the printed circuit board; a conductive pattern extended between the third conductive layer and the non-conductive plate and electrically connected with the second conductive layer; and a wireless communication circuit electrically connected with the conductive member and configured to transmit and/or receive an RF signal.

According to various embodiments of the disclosure, an electronic device includes: a housing including a first plate, a second plate facing in the opposite direction of the first plate, and a side surface member surrounding a space between the first and second plates, the side surface member including an annular conductive member; a display disposed between the first and second plates; a printed circuit board disposed in the space in parallel with the display, and including a ground plane; a support structure disposed between the display and the printed circuit board; at least one wireless communication circuit disposed on the printed circuit board; a first conductive connection member configured to connect the wireless communication circuit and the annular conductive member; a second conductive member configured to connect the ground plane and the annular conductive member; a conductive plate disposed to be spaced apart from the display and the support structure therebetween; and a conductive pattern disposed to be spaced apart from the conductive layer, disposed on a position to be electrically coupled with the conductive layer, and grounded to the ground plane of the printed circuit board.

Advantageous Effects of Invention

The electronic device according to various embodiments of the disclosure can implement a low band of an operating frequency of an antenna, and can tune an operating frequency in a low band.

BEST MODE FOR CARRYING OUT THE INVENTION

Figure 1:
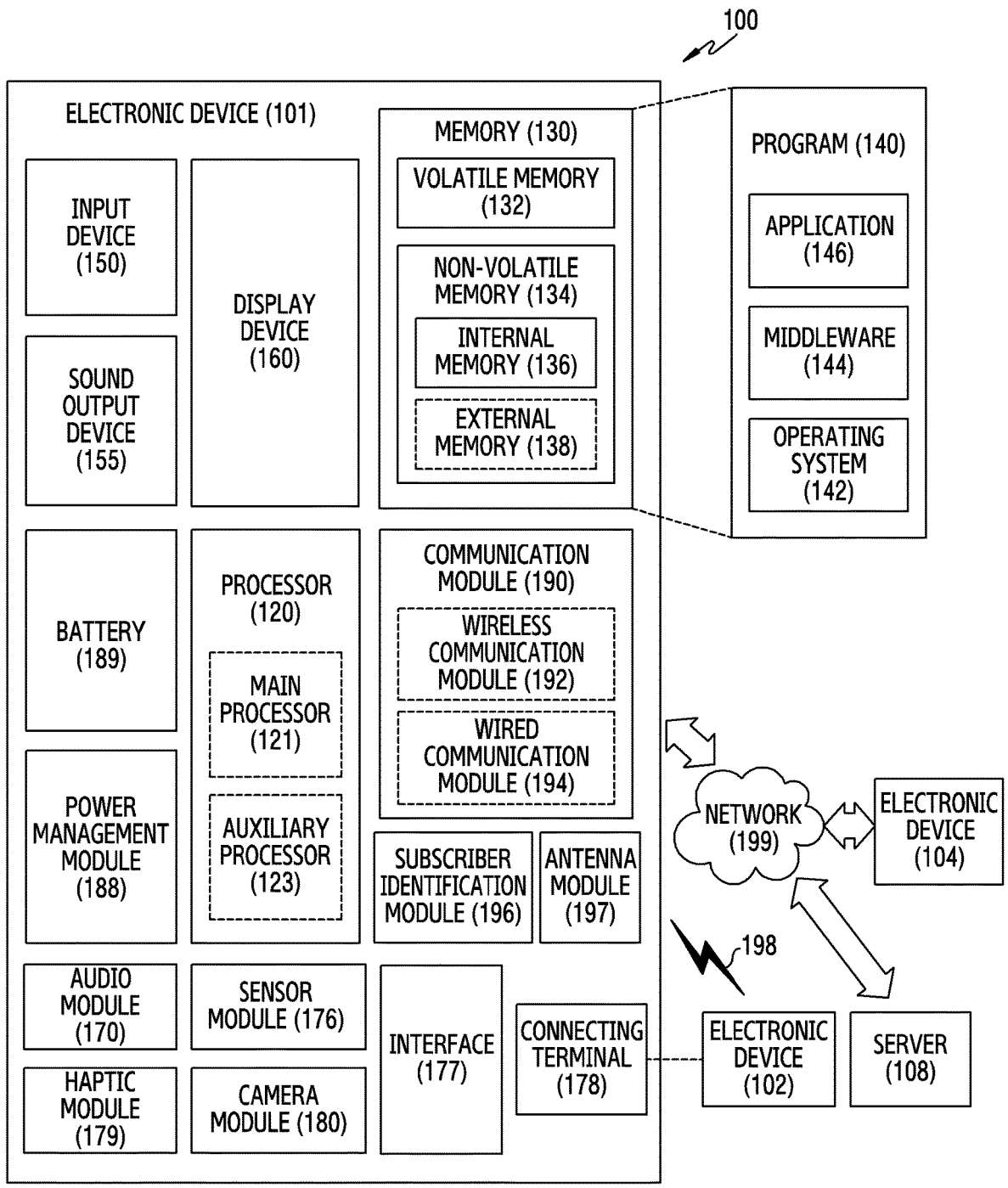
FIG. 1 is a block diagram of an electronic device in a network environment according to various embodiments of the disclosure.

Hereinafter, various embodiments of the disclosure will be described with reference to the accompanying drawings. It should be appreciated that the disclosure is not limited to specific embodiments and includes various modifications, equivalents, and/or alternatives of embodiments of the disclosure. With regard to the description of the drawings, similar reference numerals may be used to refer to similar elements.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2A:
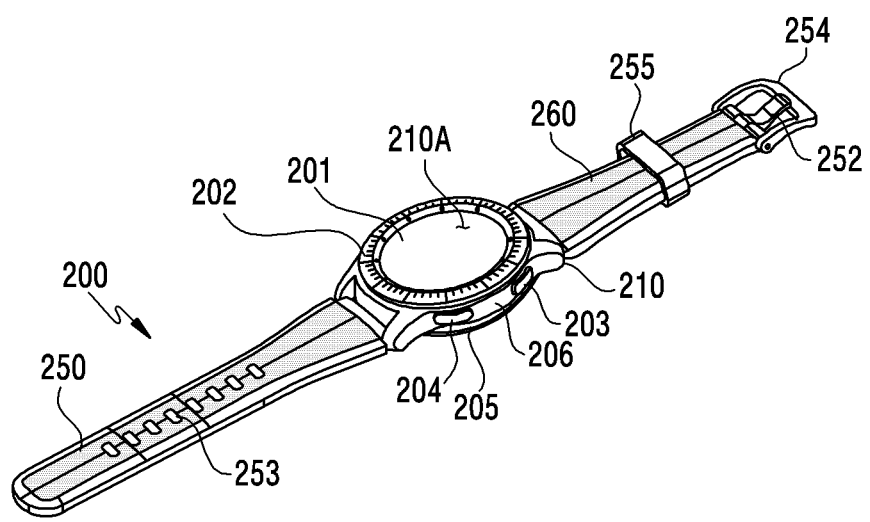
FIG. 2A is a perspective view illustrating a front surface of an electronic device according to various embodiments of the disclosure.
Figure 2B:
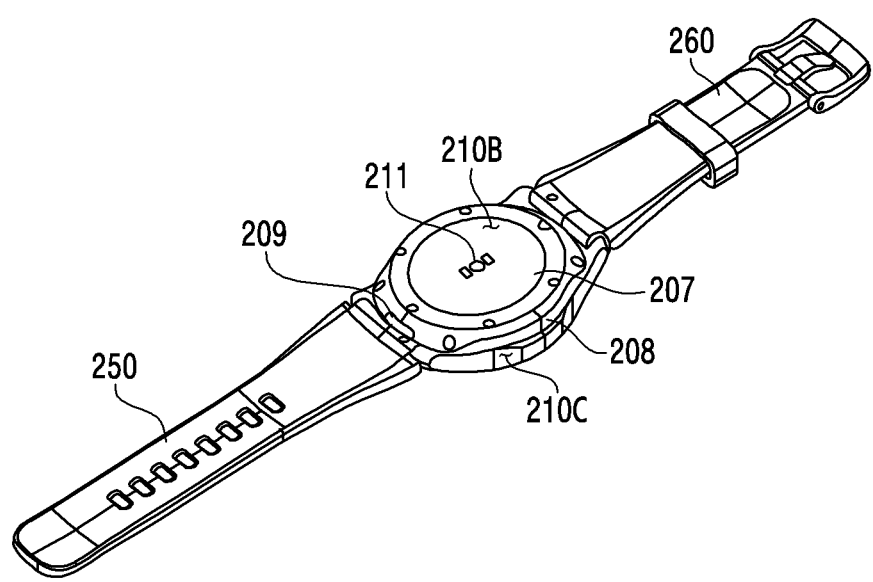
FIG. 2B is a perspective view illustrating a rear surface of the electronic device according to various embodiments of the disclosure.

FIG. 2A is a perspective view of a front surface of a mobile electronic device according to various embodiments of the disclosure. FIG. 2B is a perspective view of a rear surface of the electronic device of FIG. 2A according to various embodiments of the disclosure.

Referring to FIGS. 2A and 2B, the electronic device 200 (for example, the electronic device 101 shown in FIG. 1) according to an embodiment may include a housing 210 which includes a first surface (or a front surface) 210A, a second surface (or a rear surface) 210B, and a side surface 210C surrounding a space between the first surface 210A and the second surface 210B. In another embodiment (not shown), the housing may refer to a structure that forms a portion of the first surface 210A, the second surface 210B, and the side surface 210C of FIG. 2A.

According to an embodiment, the first surface 210A may be formed by a plate having at least a portion substantially transparent (hereinafter, a transparent plate) 201 (for example, a glass plate including various coating layers, or a polymer plate). The second surface 210B may be formed by a rear case 207 which is substantially opaque. The rear case 207 may be formed by, for example, coated or colored glass, ceramic, a polymer, metal (for example, aluminum, stainless steel (STS), or magnesium), or a combination of at least two of the above-mentioned materials. The side surface 210C may be formed by a side surface bezel structure (or a "side surface member") 206 which is coupled with the transparent plate 201 and the rear case 207, and includes metal and/or a polymer. In a certain embodiment, the rear case 207 and the side surface bezel structure 206 may be integrally formed with each other, and may include the same material (for example, a metallic material such as aluminum). The side surface bezel structure 206 is a structure that is coupled with the rear case 207, and may be referred to as a front case. According to an embodiment, the side surface bezel structure 206 may include a conductive member forming at least a portion of the side surface 210C, and the conductive member may be electrically connected with a wireless communication circuit (for example, the wireless communication module 192 of FIG. 1) to operate as an antenna (or an antenna radiator). The conductive member may have, for example, an annular shape to be disposed along the side surface 210C.

According to an embodiment, the electronic device 200 may include at least one of a display (not shown), an audio module 205, 208, a sensor module 211, key input devices 202, 203, 204, or a connector hole 209. In a certain embodiment, the electronic device 200 may omit at least one of the components (for example, the key input devices 202, 203, 204, the connector hole 209, or the sensor module 211), or may additionally include other components.

The display may be exposed through a substantial portion of the front surface plate 201, for example. According to a certain embodiment, the display 330 may be circular when viewed above the first surface 210A. According to various embodiments (not shown), the display 330 and the transparent plate 201 corresponding thereto may be formed in various other shapes (for example, an oval, polygonal shape). According to various embodiments, the display 330 may be coupled with or disposed adjacent to a touch sensing circuit, a pressure sensor for measuring an intensity (pressure) of a touch, and/or a fingerprint sensor.

According to various embodiments, the display may include the front surface plate 201, and in this case, the front surface plate 201 may be omitted from the housing 210.

The audio module 205, 208 may include, for example, a microphone hole 205 and a speaker hole 208. The microphone hole 205 may have a microphone disposed therein to acquire an external sound, and in a certain embodiment, the microphone hole may have a plurality of microphones disposed therein to detect a direction of a sound. The speaker hole 208 may be used as an external speaker and a receiver for communication. In a certain embodiment, the speaker hole 208 and the microphone hole 205 may be implemented as one hole or a speaker may be included without the speaker hole 208 (for example, a piezo speaker).

The sensor module 211 may generate, for example, an electric signal or a data value corresponding to an internal operation state or an external environment state of the electronic device 200. According to an embodiment, the sensor module 211 may include a biometric sensor 211 (for example, a heart rate monitor (HRM) sensor) disposed on the second surface 210B of the housing 210. According to various embodiments, the electronic device 200 may include various other sensors (for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor).

The key input devices 202, 203, 204 may include, for example, a wheel key 202 which is disposed on the first surface 210A of the housing 210 and is rotatable in at least one direction, and/or side key buttons 202, 203 disposed on the side surface 210C of the housing 210. The wheel key 202 may have a shape corresponding to a shape of the front surface plate 201. In another embodiment, the electronic device 200 may not include a portion or an entirety of the key input devices 202, 203, 204, and the key input device that is not included may be implemented on the display in other forms such as a soft key.

The connector hole 209 may include other connector holes (not shown) to accommodate a connector (for example, a USB connector) for transmitting and receiving power and/or data to and from an external electronic device (for example, the electronic device 102 of FIG. 1), and to accommodate a connector for transmitting and receiving an audio signal to and from an external electronic device. The electronic device 200 may further include, for example, a cover (not shown) to cover at least a portion of the connector hole 209 and to block inflow of external foreign substances into the connector hole.

According to an embodiment, the electronic device 200 may include straps 250, 260 which are utilized when the electronic device is worn on a wrist. For example, the straps 250, 260 may include a first strap 250 and a second strap 260 which are coupled with the side surface bezel structure 206, and are disposed at both sides of the side surface bezel structure 206. The straps 250, 260 may be formed by, for example, at least one of a fabric, leather, rubber, urethane, metal, or ceramic.

According to an embodiment, the first strap 250 may include a plurality of coupling holes 253, and the second strap 260 may include a fastening structure 252, 254 which allows the first strap 250 to pass therethrough to be fastened to the coupling holes. According to various embodiments, various other structures for allowing the electronic device 200 to be worn on a user may be provided.

Figure 3A:
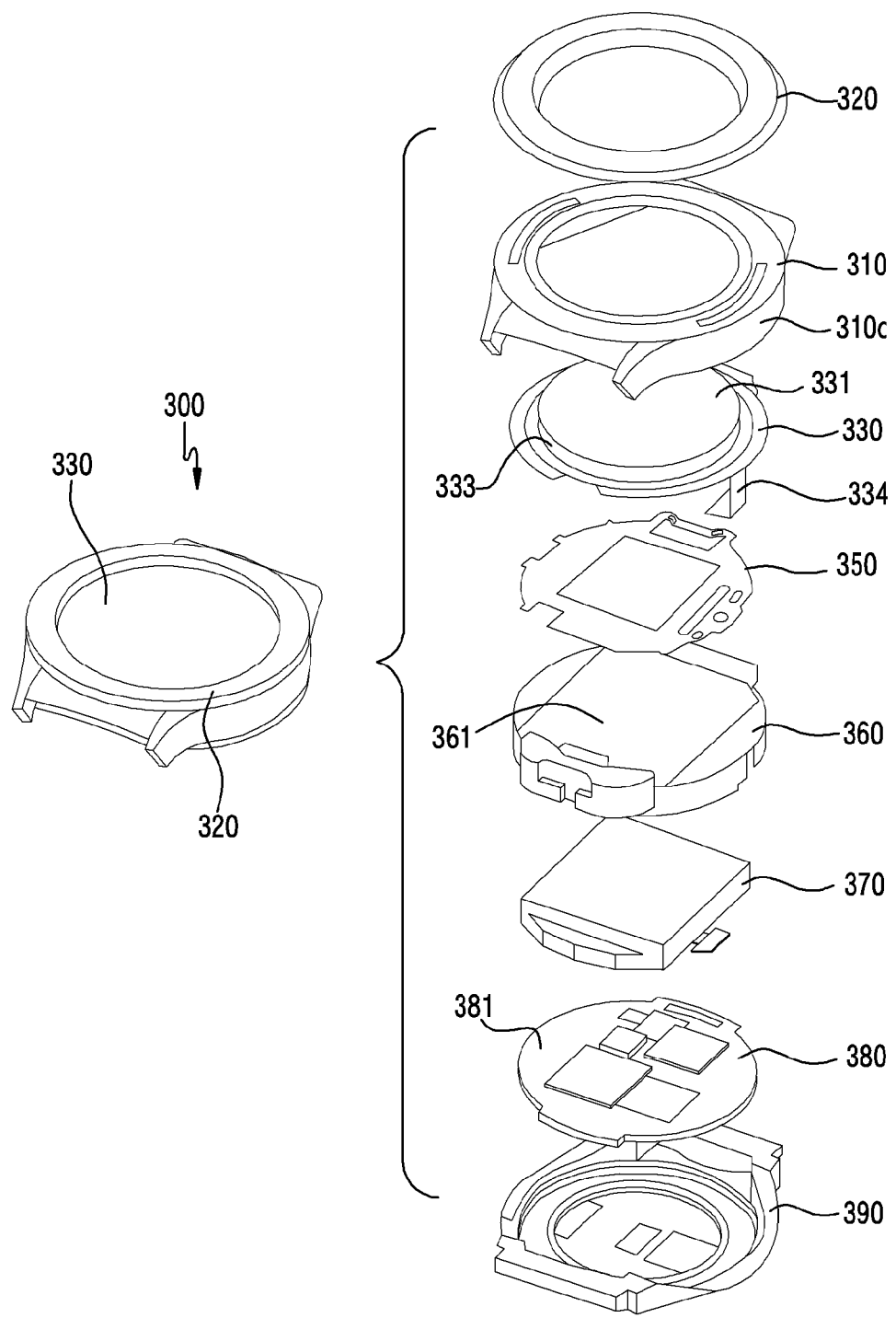
FIG. 3A is an exploded perspective view illustrating an inner configuration of an electronic device according to various embodiments of the disclosure.
Figure 3B:
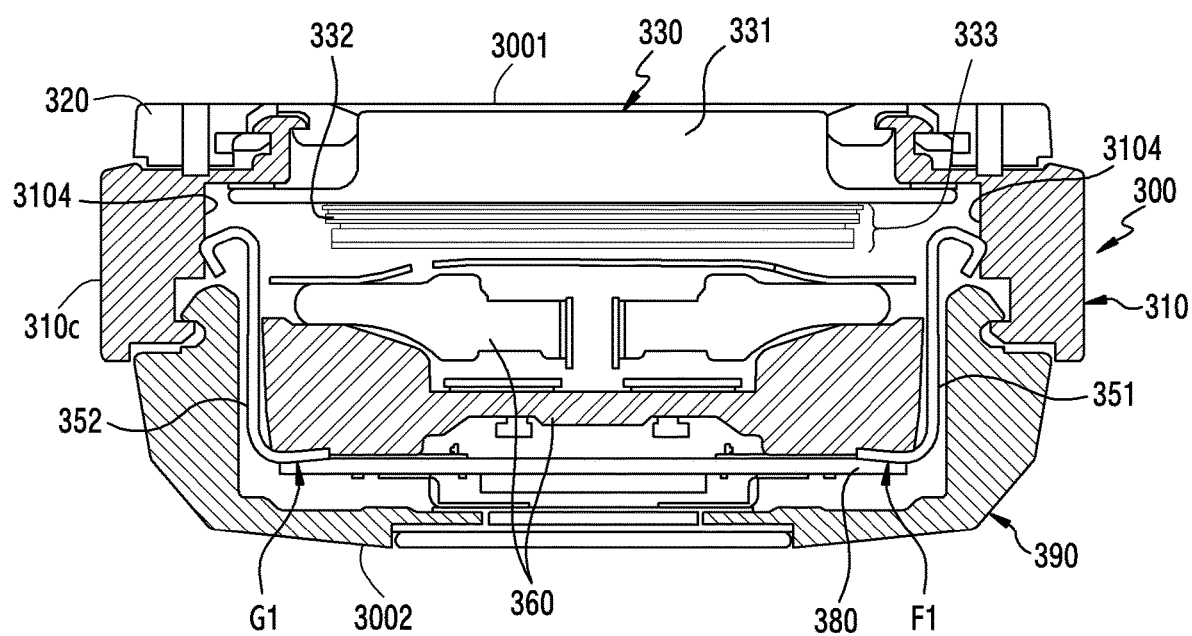
FIG. 3B is a cross-sectional view of an electronic device illustrating an electric connection state between a feeding portion and a ground portion according to various embodiments of the disclosure.

FIG. 3A is an exploded perspective view of an electronic device according to an embodiment of the disclosure. FIG. 3B is a cross-sectional view of the electronic device illustrating an electric connection state between a feeding portion and a ground portion according to various embodiments of the disclosure.

Referring to FIGS. 3A and 3B, the electronic device 300 (for example, the electronic device 101 of FIG. 1 or the electronic device 200 of FIG. 2A) in an embodiment may include a conductive member 310, a wheel key 320 (for example, the wheel key 202 of FIG. 2A), a display 330, a printed circuit board 380, a third conductive layer 350, a support structure 360 (for example, a bracket), a battery 370, a rear case 390.

The conductive member 310 according to an embodiment may include a structure (for example, the side surface bezel structure 206 of FIG. 2A) forming at least a portion of a side surface 310C (for example, the side surface 210C of FIG. 2A) of the electronic device 300. For example, the conductive member 310 is a structure that is coupled with the rear case 390 (for example, the rear case 207 of FIG. 2A), and is referred to as a front case. According to an embodiment, the conductive member 310 may have an annular shape to be disposed along the side surface 310C. According to an embodiment, the conductive member 310 may be electrically connected with a wireless communication circuit (for example, the wireless communication module 192 of FIG. 1), and may operate as an antenna. For example, the wireless communication circuit mounted on the printed circuit board 380 may provide a signal (or a current) to the conductive member 310, and the conductive member 310 may emit electromagnetic waves to the outside.

According to an embodiment, the display 330 may include a window (or a transparent plate) 331 and a display panel 333. The window 331 may form at least a portion of a front surface (for example, the first surface 210A of FIG. 2A) of the electronic device 300. The window 331 may be formed with, for example, glass, plastic, or a polymer. The display panel 333 may include a plurality of pixels which are implemented by a plurality of light emitting elements (for example, an organic light emitting diode (OLED)). Light outputted from the display panel 333 may be discharged to the outside after passing through the window 331.

According to an embodiment, the display panel 333 may include a first conductive layer 332. For example, the first conductive layer 332 may be disposed on a back surface of the display panel 333. According to an embodiment, the first conductive layer 332 may be disposed inside the display panel 333. According to an embodiment, the first conductive layer 332 may be a ground plane that is disposed on the display panel 333. According to various embodiments, the first conductive layer 332 may include at least one of a plurality of layers disposed on the display 330. For example, the first conductive layer 332 may include a shielding layer or a copper sheet layer used as a ground.

According to an embodiment, the display 330 may include a flexible circuit board (for example, a flexible printed circuit board (FPCB)) 334. The display 330 may be electrically connected with the printed circuit board 380 through the flexible circuit board 334. For example, one end of the flexible circuit bord 334 may be electrically connected with the display 330, and the other end of the flexible circuit board 334 may be electrically connected with the printed circuit board 380. A signal for controlling the display panel 333 may be outputted from a processor (for example, the processor 120 of FIG. 1) mounted on the printed circuit board 380, and this signal may be provided to the display panel 333 through the flexible circuit board 334.

According to various embodiments, the display 330 may include a conductive pattern to support a touch input or a hovering input. The conductive pattern may be disposed inside (for example, in an on-cell area or an in-cell area) the display panel 333, or may be disposed between the display panel 333 and the window 331. A touch input or hovering input inputted through the conductive pattern may be provided to the processor (for example, the processor 120 of FIG. 1) through the flexible circuit board 334.

According to an embodiment, the printed circuit board 380 may be disposed between the display 330 and a rear surface 3002 (for example, the rear surface 210B of FIG. 2B). According to an embodiment, the printed circuit board 380 may be disposed to be spaced apart from the display 330, and may include a second conductive layer 381 facing the first conductive layer 332 of the display 330 at least in part. According to an embodiment, the second conductive layer 381 may include a ground plane.

The printed circuit board 380 may have the processor (for example, the processor 120 of FIG. 1), a memory (for example, the memory 130 of FIG. 1), and/or an interface mounted thereon, for example. The processor may include, for example, one or more of a central processing device, an application processor, a graphic processing unit (GPU), an application processor, a sensor process, or a communication processor. The memory may include, for example, a volatile memory or a nonvolatile memory. The interface may include, for example, a high definition multimedia interface (HDMI), a universal serial bus (USB) interface, a secure digital (SD) card interface, and/or an audio interface. The interface may electrically or physically connect the electronic device 300 with an external electronic device, and may include a USB connector, an SD card/multimedia connect (MMC) connector, or an audio connector.

According to an embodiment, the third conductive layer 350 may be disposed between the display 330 and the printed circuit board 380. For example, the third conductive layer 350 may be disposed to be spaced apart from the display 330 and the printed circuit board 380.

According to an embodiment, the support structure 360 may be disposed in a space that is formed by the conductive member 310 and the rear case 390, and electronic components (for example, the display 330, the printed circuit board 380, or the battery 370) may be disposed on the support structure 360. For example, the display 360 may be disposed on one surface of the support structure 360 and the battery 370 and/or the printed circuit board 380 may be disposed on the other surface of the support structure 360.

According to an embodiment, the support structure 360 may include a non-conductive plate 361 disposed between the third conductive layer 350 and the printed circuit board 380. According to an embodiment, the non-conductive plate 361 may contact the third conductive layer 350 at least in part.

According to an embodiment, the battery 370 is a device that supplies power to at least one component of the electronic device 300, and may include, for example, a primary battery which is not rechargeable or a secondary battery which is rechargeable, or a fuel cell. The battery 370 may be integrally disposed inside the electronic device 300, or may be removably disposed in the electronic device 300.

According to an embodiment, the third conductive layer 350 is a sheet-shaped or a thin film-shaped conductive plate, and may be disposed between the display 330 and the non-conductive plate 361. For example, the third conductive layer 350 may face the display 330 and may face the non-conductive plate 361. According to an embodiment, the third conductive layer 350 may be disposed to be physically separated from the display 330.

Referring to FIG. 3B, the conductive member 310 in an embodiment may be electrically connected with a feeding portion F1 and a first ground portion G1 of the printed circuit board 380. According to an embodiment, the feeding portion F1 may be electrically connected by contacting an inner surface 3104 of the conductive member 310 by means of a first conductive connection member 351 connected with the printed circuit board 380. According to an embodiment, the first ground portion G1 may be electrically connected by contacting an inner surface 310d of the conductive member 310 by means of a second conductive connection member 352 connected with the printed circuit board 380. According to an embodiment, the first conductive connection member 351 and/or the second conductive connection member 352 may be electrically connected with the conductive member 310 from the printed circuit board 380 by detouring or passing through the support structure 360. According to an embodiment, the first conductive connection member 351 may form a first electronic path (or a conductive path) between the conductive member 310 and the printed circuit board 380. The second conductive connection member 352 may form a second electronic path between the conductive member 310 and the printed circuit board 380. The first conductive connection member 351 and/or the second conductive connection member 352 may include, for example, at least one of an FPCB, a wire cable, a conductive connector, or a C-clip. The first conductive connection member 351 and/or the second conductive connection member 352 may include various other conductive members.

According to various embodiments, the conductive member 310 may operate as an antenna having a radiation path corresponding to an electric length from the feeding portion F1 to the first ground portion G1. For example, the wireless communication circuit (for example, the wireless communication module 192 of FIG. 1) may provide a current to the feeding portion F1, and, while the current is circulated through the conductive member 310 and flows into the first ground portion G1, a transmission line for transmitting or receiving radio electromagnetic waves in at least one frequency band may be formed. According to various embodiments, the first conductive connection member 351 and/or the second conductive connection member 352 may operate as an antenna along with the conductive member 310.

Figure 4A:
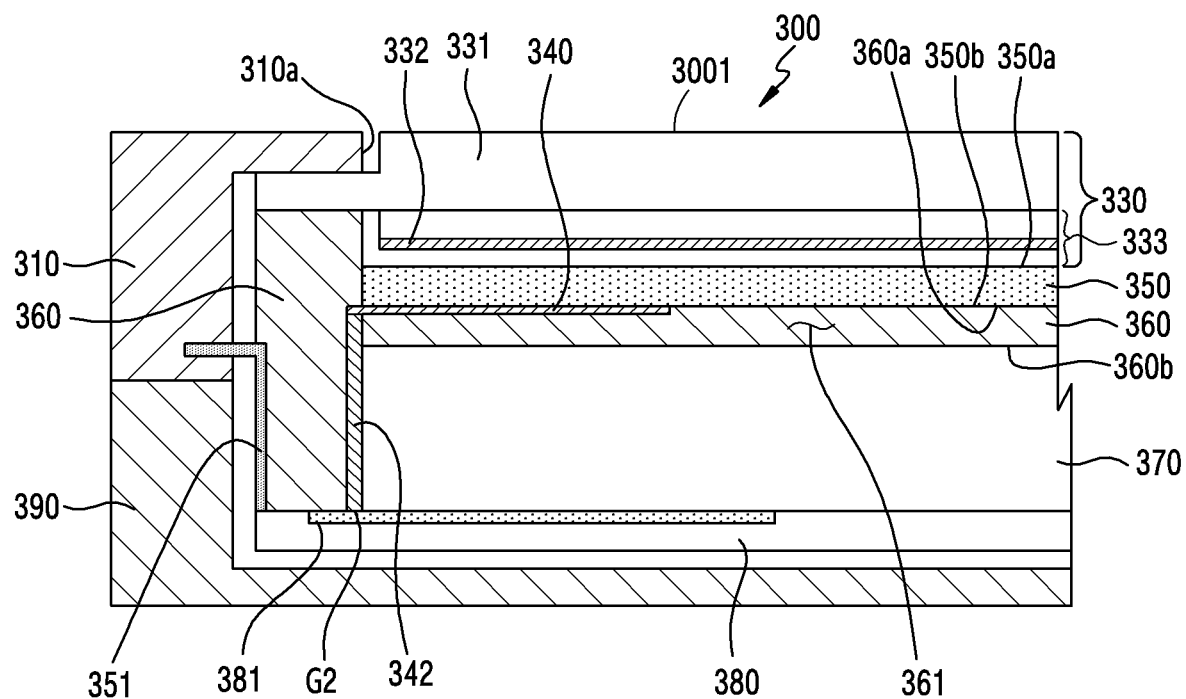
FIGS. 4A to 4C are cross-sectional views of an electronic device according to an embodiment of the disclosure.
Figure 4B:
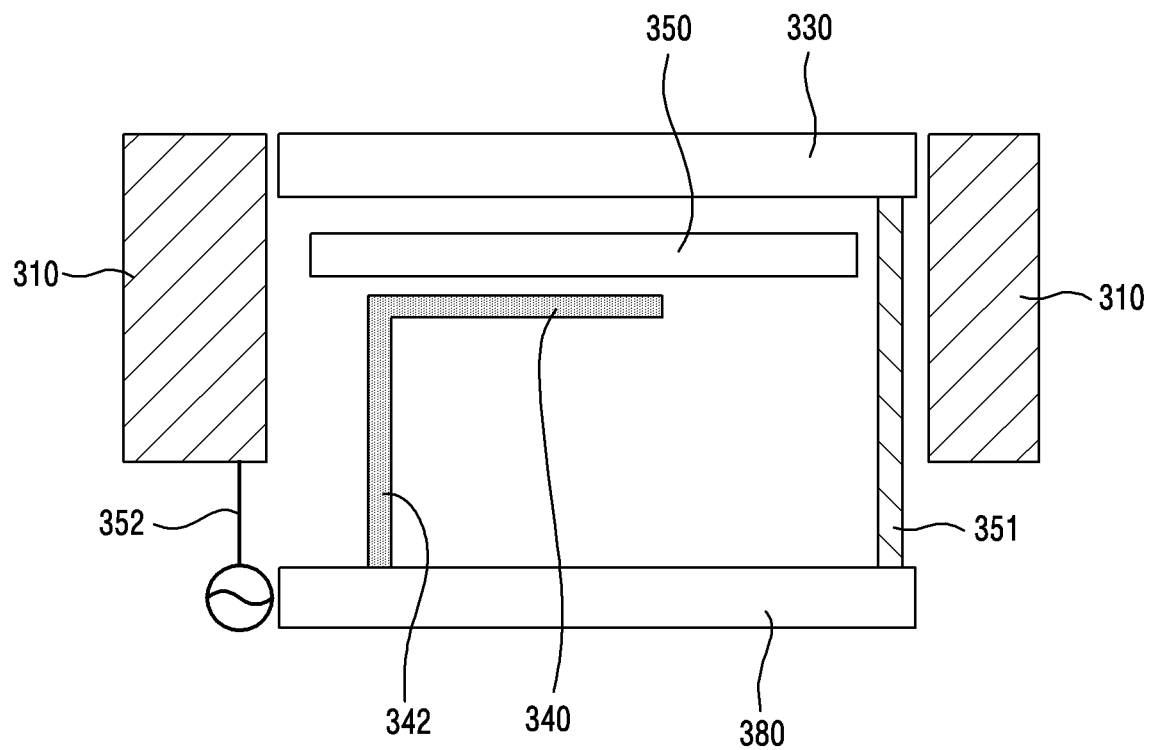

FIGS. 4A and 4B are cross-sectional views of an electronic device according to an embodiment of the disclosure.

Referring to FIG. 4A, the electronic device 300 in an embodiment may include at least one of a conductive member 310, a rear case 390, a second conductive connection member 352, a display 330 including a first conductive layer 332, a printed circuit board 380 including a second conductive layer 381, a third conductive layer 350, a support structure 360, or a battery 370.

The conductive member 310 may form, for example, at least a portion of a side surface (for example, the side surface 210C of FIG. 2B) of the electronic device 300. The rear case 390 may form at least a portion of a rear surface 300₂ (for example, the rear surface 210B of FIG. 2B) of the electronic device 300.

According to an embodiment, the display 330 may be disposed in an opening 310a of the conductive member 310 to form a portion of a front surface 300₁ (for example, the front surface 210A of FIG. 2A) facing opposite the rear surface 300₂ of the electronic device 300. For example, the display 330 may include a window 331 forming the front surface 300₁. According to various embodiments, the window 331 may be provided as a portion of a housing (for example, the housing 210 of FIG. 2A), and in this case, the window 331 may be omitted from the display 330.

According to an embodiment, a display panel 333 of the display 330 may be disposed on a back surface of the window 331, and may include the first conductive layer 332. According to an embodiment, the first conductive layer 332 may form at least a portion of the back surface of the display panel 333. According to an embodiment, the first conductive layer 332 may face the third conductive layer 350 at least in part. In a certain embodiment, the first conductive layer 332 may be disposed inside the display panel 333.

According to an embodiment, the first conductive layer 332 may be electrically connected with a ground plane (for example, the second conductive layer 381) of the printed circuit board 380. Referring to FIG. 3A, the first conductive layer 332 may be electrically connected with the second conductive layer 381 of the printed circuit board 380 through a flexible printed board (for example, a flexible printed circuit board (FPCB) 334) electrically connecting the display 330 and the printed circuit board 380.

According to an embodiment, the printed circuit board 380 may be disposed between the display 330 and the rear surface 300₂ in a space (not shown) formed by the conductive member 310 and the rear case 390. The printed circuit board 380 may be disposed to be spaced apart from the display 330. According to an embodiment, when viewed above the first conductive layer 332, the second conductive layer 381 of the printed circuit board 380 may overlap the first conductive layer 332 at least in part.

According to an embodiment, the third conductive layer 350 may be disposed between the first conductive layer 332 and the second conductive layer 381 to face the first conductive layer 332. The third conductive layer 350 may be spaced apart from the display 330 and the printed circuit board 380. According to an embodiment, the third conductive layer 350 may be in an electric floating state.

According to an embodiment, the support structure 360 may include a non-conductive plate 361 disposed between the third conductive layer 350 and the printed circuit board 380. According to an embodiment, the non-conductive plate 361 may contact the third conductive layer 350 at least in part. For example, the support structure 360 may be integrally formed with one non-conductive material to provide the non-conductive plate 361. According to various embodiments, the support structure 360 may further include a portion that is formed with a non-conductive material different from the non-conductive plate 361, or a metallic material.

In an embodiment, the non-conductive plate 361 may include a first surface 361a facing the display 330, and a second surface 361b facing opposite the first surface 361a.

According to an embodiment, the third conductive layer 350 may include a second surface 350b facing the first surface 361a of the non-conductive plate 361, and a first surface 350a facing opposite the second surface 350b. According to an embodiment, the second surface 350b of the third conductive layer 350 may contact the first surface 361a of the non-conductive plate 361 at least in part.

According to an embodiment, a conductive pattern 340 may be extended between the third conductive layer 350 and the non-conductive plate 361, and may be electrically connected with the second conductive layer 381 of the printed circuit board 380. According to an embodiment, the conductive pattern 340 may be physically or electrically separated from the third conductive layer 350.

According to an embodiment, the conductive member 310 may be electrically connected with a wireless communication circuit (for example, the wireless communication circuit 192 of FIG. 1) mounted on the printed circuit board 380 through a first conductive connection member 351. The wireless communication circuit may provide a signal (or a current) to the conductive member 310 through the first conductive connection member 351, and the conductive member 310 may operate as an antenna to transmit and/or receive an electromagnetic field (electromagnetic energy or electromagnetic wave).

According to an embodiment, at least one of the first conductive layer 332, the conductive pattern 340, or the third conductive layer 350 electrically connected with the second conductive layer 281 (for example, the ground plane) of the printed circuit board 380 may operate as a frequency adjustment circuit related to a transmission line utilizing the conductive member 310. The transmission line is a structure for transmitting a signal (voltage, current) of a radio frequency, and may be defined as a conductor system which uses a transmission action of waves by an electric parameter (resistance, inductance, conductance, capacitance per unit length). According to an embodiment, at least one of the first conductive layer 332, the conductive pattern 340 or the third conductive layer 350 may shift a resonant frequency related to an antenna utilizing the conductive member 310 to a designated frequency, or shift the resonant frequency as much as designated.

For example, referring to FIGS. 4A and 4B, the conductive member 310 may be capacitively coupled with the first conductive layer 332 and/or the conductive pattern 340. The conductive pattern 340 and/or the first conductive layer 332 may be capacitively coupled with the third conductive layer 350. Accordingly, an antenna ground related to the corresponding transmission line may be extended, and a resonant frequency required in a corresponding communication mode may be formed.

According to various embodiments, the conductive pattern 340 or the first conductive layer 332 electrically connected with the second conductive layer 381 (for example, the ground plane) may operate as a branch line (for example, a stub) connected to the transmission line in parallel.

According to an embodiment, the conductive pattern 340 may be attached to the non-conductive plate 361 or may be formed on the support structure 360. For example, the conductive pattern 340 may be attached to or formed on the non-conductive plate 361 and/or another structure disposed in the conductive member 310 in the form of laser direct structuring (LDS), thin film antenna (TFA), flexible printed circuit board (FPCB), or steel use stainless (SUS).

According to an embodiment, at least one non-conductive member may be disposed between the conductive pattern 340 and the third conductive layer 350. For example, the non-conductive member may be formed on the conductive pattern 340 or the third conductive layer 350. For example, the non-conductive member may be an insulation layer that is disposed on one surface of the conductive pattern 340 facing the third conductive layer 350, or an insulation layer that is disposed on one surface of the third conductive layer 350 facing the conductive pattern 340. According to an embodiment, the conductive pattern 340 and the third conductive layer 350 may be physically separated from each other by the at least one non-conductive member (for example, the insulation layer).

Figure 4C:
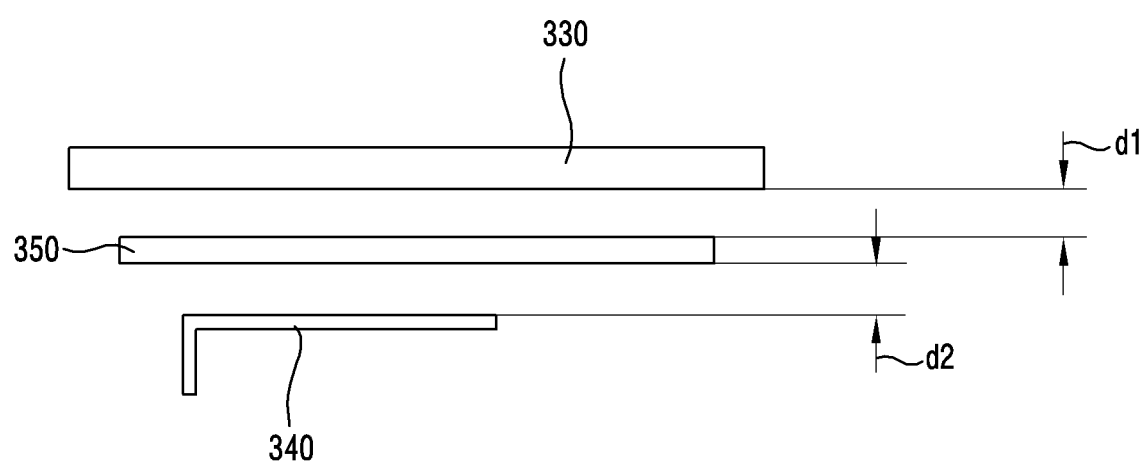

Referring to FIG. 4C, the display 330 and the third conductive layer 350 may be spaced apart from each other to have a gap d1 therebetween. For example, the gap d1 may be between about 0.1 mm and about 0.2 mm. The gap d1 may be a distance between the display 330 and the first surface (for example, the first surface 350a shown in FIG. 4A) of the third conductive layer 350. For example, when an insulation layer is coated over the first surface (for example, the first surface 350a shown in FIG. 4A) of the third conductive layer 350 as much as the gap d1, the first surface 350a of the third conductive layer 350 may contact the display 330.

According to an embodiment, the third conductive layer 350 and the conductive pattern 340 may be attached to each other or may be spaced apart from each other to have a gap d2 therebetween. The third conductive layer 350 may have an insulation layer formed on the second surface 350b facing the support structure (for example, the support structure 360 shown in FIG. 4A), and may be attached to the support structure 360, and may be disposed to have a gap with the conductive pattern 340 due to the insulation layer. For example, the gap d2 may be less than or equal to about 0.05 mm. The gap d2 may be a distance between the second surface (for example, the second surface 350b shown in FIG. 4A) of the third conductive layer 350 and the conductive pattern 340.

Figure 5A:
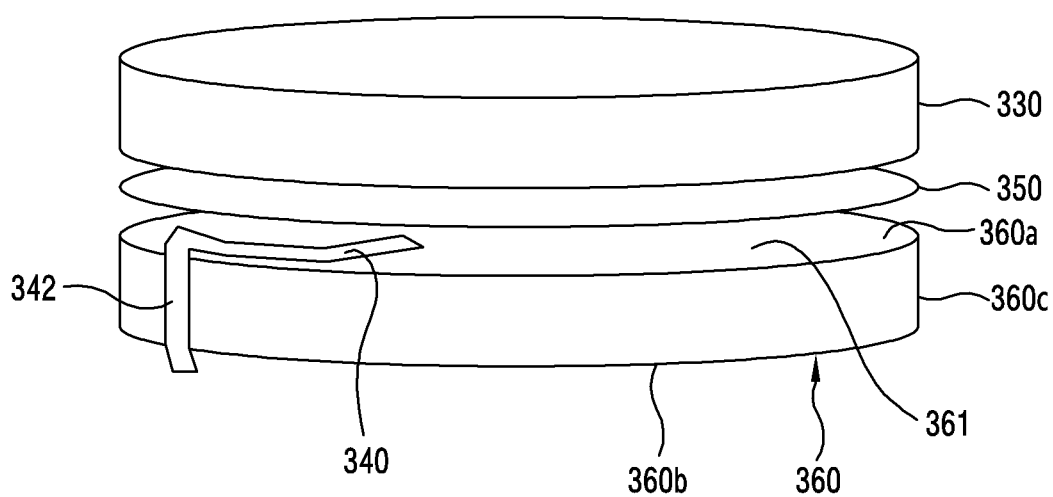
FIG. 5A is a perspective view schematically illustrating an arrangement state of a conductive pattern according to various embodiments of the disclosure.
Figure 5B:
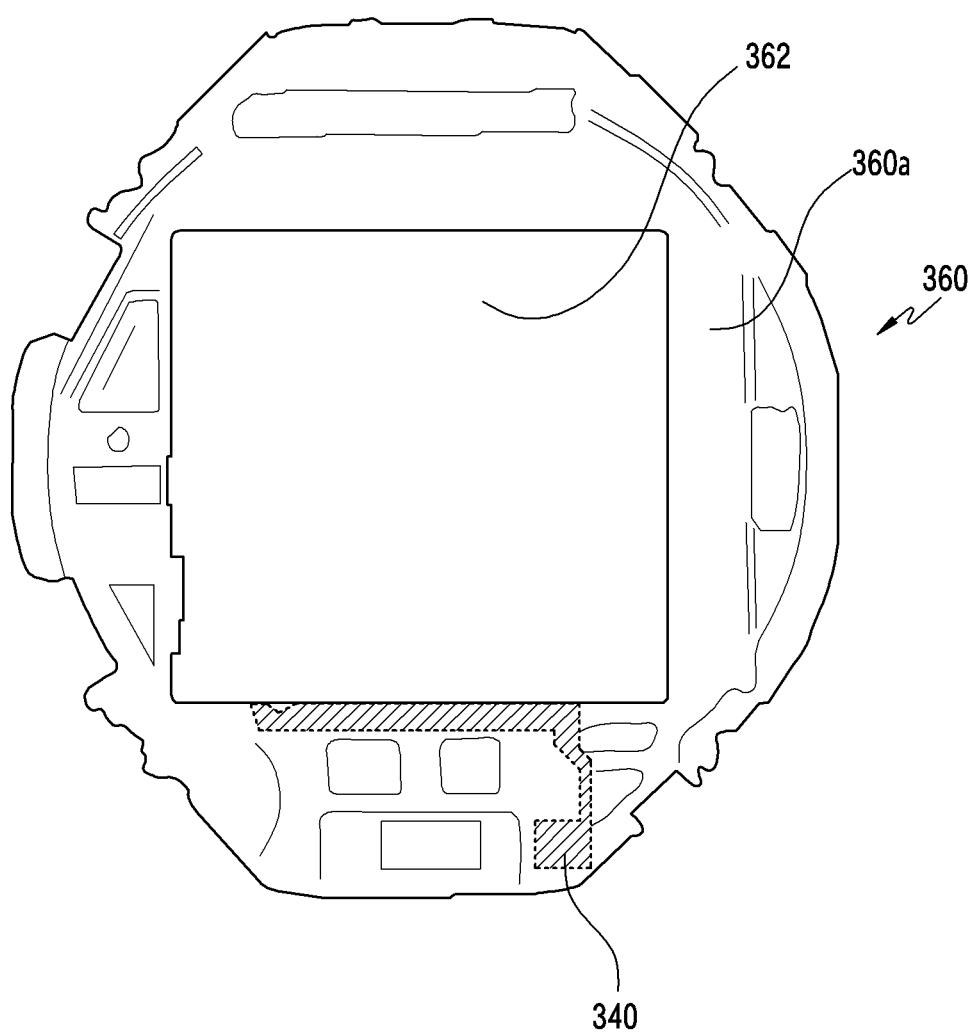
FIG. 5B is a top view illustrating a support member according to various embodiments of the disclosure.
Figure 5C:
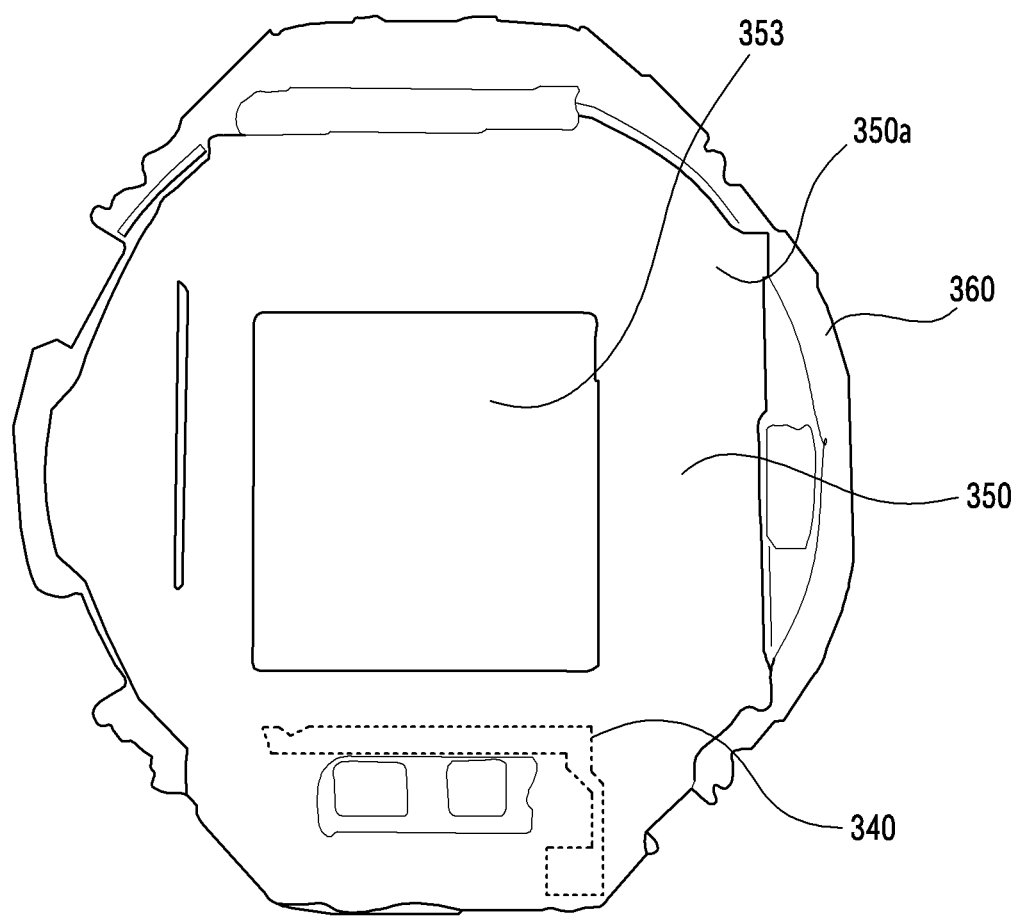
FIG. 5C is a top view illustrating an arrangement state of a conductive plate on the support member according to various embodiments of the disclosure.

FIG. 5A is a perspective view schematically illustrating an arrangement state of a conductive pattern according to various embodiments of the disclosure. FIG. 5B is a top view illustrating a support structure according to various embodiments of the disclosure. FIG. 5C is a top view illustrating a state in which a third conductive layer is disposed on the support structure according to various embodiments of the disclosure.

Referring to FIG. 5A, the support structure 360 according to various embodiments may include a first surface 360a facing in a first direction (for example, a direction toward the front surface plate 201 of FIG. 2), a second surface 360b facing in a second direction (for example, a direction toward the rear case 390 of FIG. 3A) which is the opposite direction of the first direction, and a side surface 360c disposed to surround at least a portion of a space between the first surface 360a and the second surface 360b.

According to an embodiment, the conductive pattern 340 may be disposed on the first surface 360a of the support structure 360. The conductive pattern 340 may be disposed on a non-conductive area of the support structure 360, and may be disposed on the periphery of a battery receiving opening 362 of the support structure 360.

According to an embodiment, the conductive pattern 340 may be connected to a second conductive layer (for example, the second conductive layer 381 of FIG. 4A) of a printed circuit board (for example, the printed circuit board 380 of FIG. 3A) by an extension portion 342. According to an embodiment, the extension portion 342 may be disposed on the side surface 360c of the support structure 360. For example, the extension portion 342 may include an FPCB, a wire cable, a conductive member, or a C-clip. In an embodiment, when the extension portion 342 is integrally formed with the conductive pattern 340, an end of the extension portion 342 may be electrically connected with the second conductive layer (for example, the second conductive layer 381 of FIG. 4A) of the printed circuit board.

According to an embodiment, at least a portion of a conductive layer 350 may overlap the conductive pattern 340 when viewed above a first plate.

Referring to FIG. 5B, the support structure 360 according to various embodiment may have the opening 362 formed on a center area thereof to receive a battery (for example, the battery 370 shown in FIG. 3A). The opening 362 may be a battery mounting space to have the battery received therein.

Referring to FIG. 5C, the support structure 360 according to various embodiments may have the conductive pattern 340 and the third conductive layer 350 disposed on the first surface 360a thereof. When viewed above the first surface 360a, at least a portion of the conductive pattern 340 disposed on the support structure 360 may overlap the third conductive layer 350. According to an embodiment, the third conductive layer 350 may have an opening 353 formed on a center area thereof by considering swelling of the battery 370. For example, the opening 353 may include a rectangular or square shape.

According to an embodiment, the third conductive layer 350 may be formed to have an area enough to cover at least most of the first surface 360a of the support structure 360, for example, an area enough to cover about ⅔ or more.

Figure 6:
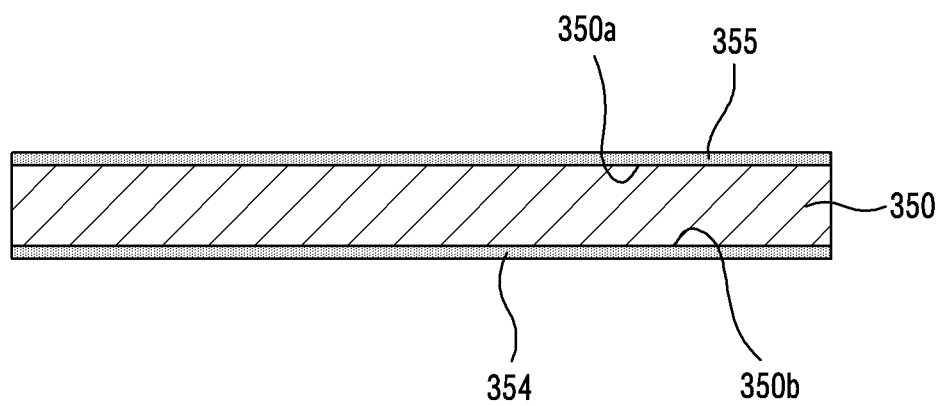
FIG. 6 is a cross-sectional view of a conductive plate according to various embodiments of the disclosure.

FIG. 6 is a cross-sectional view of the third conductive layer according to various embodiments of the disclosure.

Referring to FIG. 6, the third conductive layer 350 according to various embodiments is formed with a SUS material, and may include a first surface 350a facing the display 330 and a second surface 350b facing the support structure 360. A first insulation layer 355 may be coated over the first surface 350a and a second insulation layer 354 may be coated over the second surface 350b. When the third conductive layer 350 is attached to a first surface (for example, the first surface 360a of FIG. 5A) of the support structure 360, the third conductive layer 350 may be spaced apart from a conductive pattern (for example, the conductive pattern 340 of FIG. 5A) to have a gap (for example, the gap d2 of FIG. 4C) by the second insulation layer 354.

Figure 7:
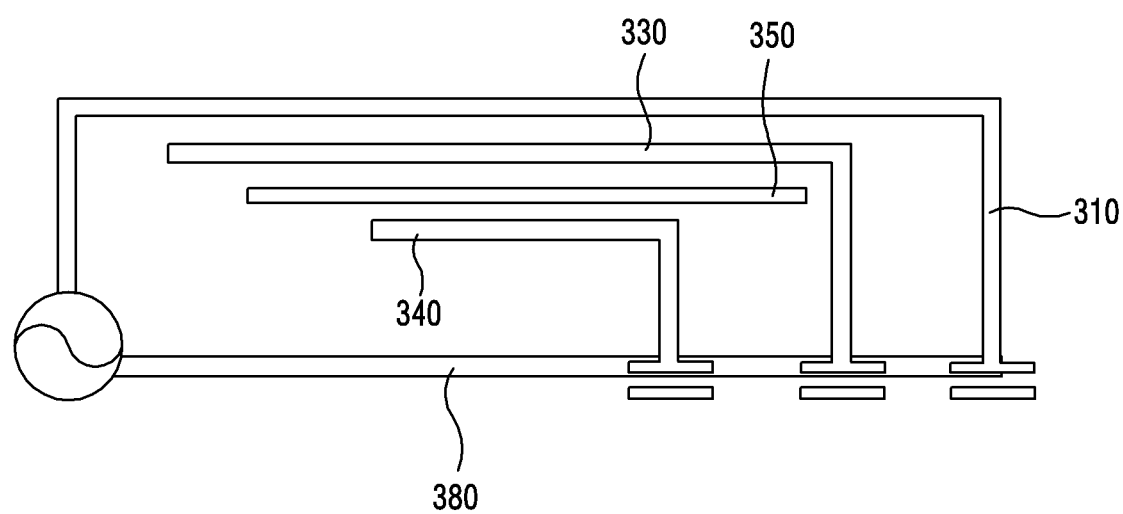
FIG. 7 is a view schematically illustrating an antenna structure according to various embodiments of the disclosure.

FIG. 7 is a view schematically illustrating an antenna structure according to various embodiments of the disclosure.

Referring to FIG. 7, a conductive member 310 according to various embodiments may be disposed on a position to be electrically coupled with a first conductive layer (for example, the first conductive layer 332 of FIG. 4A) of a display 330, the first conductive layer of the display 330 may be disposed on a position to be electrically coupled with a third conductive layer 350, and the third conductive layer 350 may be disposed on a position to be electrically coupled with a conductive pattern 340.

According to this arrangement structure, a low-band resonance phenomenon occurs between the conductive member 310 and the display 330 due to an electric coupling operation between the display 330 and the third conductive layer 350, between the third conductive layer 350 and the conductive pattern 340, such that an operating frequency band of the conductive member 310 is shifted to a low band.

Figure 8A:
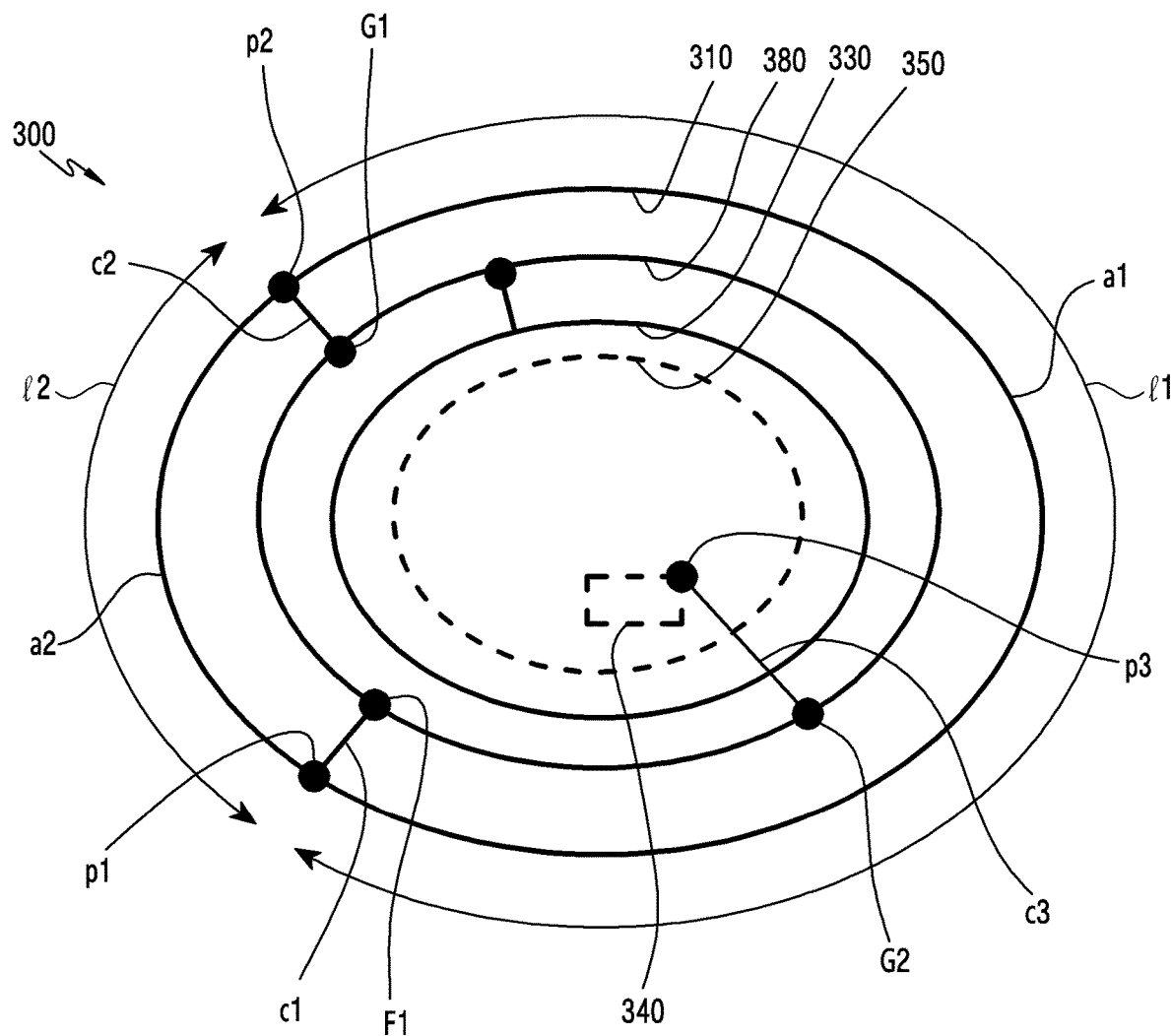
FIG. 8A is a view schematically illustrating a structure of an electronic device including an antenna according to various embodiments of the disclosure.
Figure 8B:
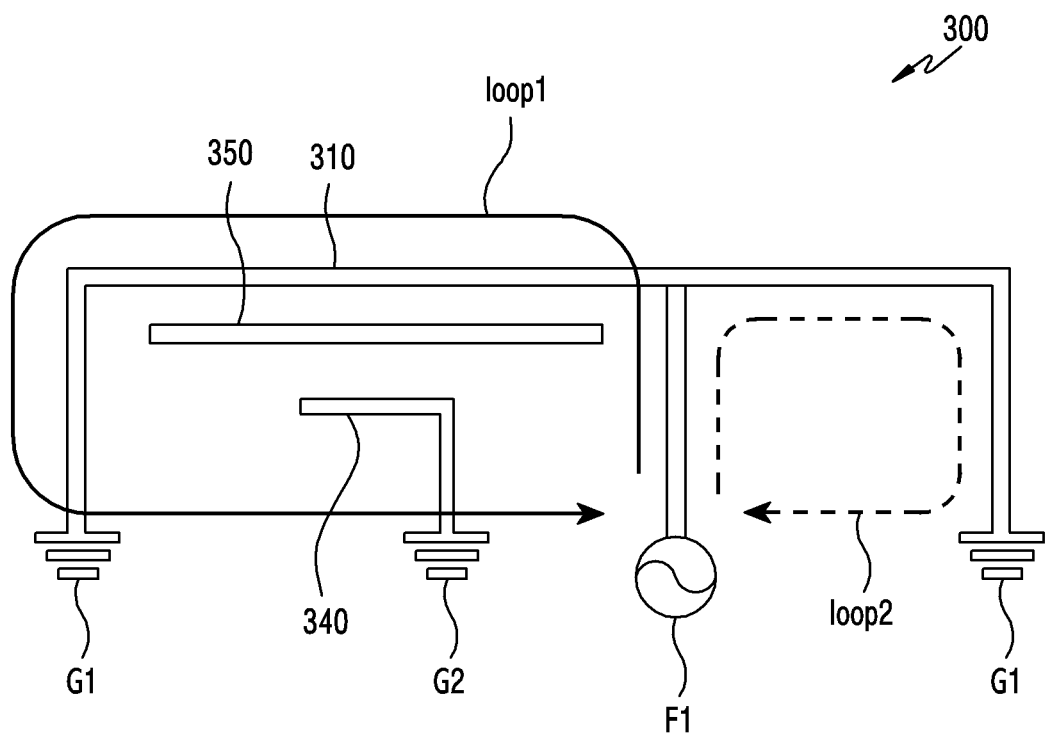
FIG. 8B is a view schematically illustrating a radiation path of the electronic device according to various embodiments of the disclosure.

FIG. 8A is a view of a configuration of an electronic device including an antenna according to various embodiments of the disclosure. FIG. 8B is a view illustrating a radiation path of the electronic device according to various embodiments of the disclosure.

The electronic device 300 of FIG. 8A may be similar to the electronic device 101 of FIG. 1, the electronic device 200 of FIG. 2A, or the electronic device 300 of FIG. 3A at least in part, or may include other embodiments of the electronic device.

Referring to FIG. 8A, the electronic device 300 may include a conductive member 310 which has at least a portion thereof formed with a conductive material and has a closed loop. According to an embodiment, the electronic device 300 may include a feeding portion F1 which is electrically connected with a wireless communication circuit (for example, the wireless communication module 192 of FIG. 1) of a printed circuit board 380 from a first point p1 of the conductive member 310 through a first conductive connection member c1 (for example, the first conductive connection member 351 shown in FIG. 3B). According to an embodiment, the electronic device 300 may include a first ground portion G1 which is electrically connected with a ground plane (for example, a ground area) of the printed circuit board 380 from a second point p2 spaced apart from the first point p1 of the conductive member 310 through a second conductive connection member c2 (for example, the second conductive connection member 352 shown in FIG. 3B). According to an embodiment, the electronic device 300 may include a second ground portion G2 where a conductive pattern 340 is electrically connected with the wireless communication circuit (for example, the wireless communication module 192 of FIG. 1) of the printed circuit board 380 through a third conductive connection member c3. For example, the third conductive connection member c3 may be an extension portion (for example, the extension portion 342 shown in FIG. 4A or the extension portion 342 shown in FIG. 5A).

According to an embodiment, a first area a1 of the conductive member 310 defined between the first point p1 and the second point p2 may be set to have a first length l1, and a second area a2 of the conductive member 310 defined between the first point p1 and the second point p2 may be set to have a second length l2 shorter than the first length l1. For example, the first length l1 of the first area may be a first electric length which operates as an antenna radiator, and the second length l2 of the second area may be a second electric length which operates as an antenna radiator.

According to an embodiment, the feeding portion F1 and the first ground portion G1 may be connected to an inner surface of the conductive member 310 from the printed circuit board 380 by respective electric connection members (for example, the electric connection members 351, 352 of FIG. 3B). According to an embodiment, the second ground portion G2 may be formed by electrically connecting the conductive pattern 340, which is disposed to be coupled with a third conductive layer 350 in the conductive member 310, and the printed circuit board 380. The conductive pattern 340 may be disposed adjacent to the first area.

According to various embodiments, the conductive member 310 may operate as an antenna by using the feeding portion F1 and the first ground portion G1. According to an embodiment, the conductive member 310 may operate as a first antenna having the first electric length of the first area a1 formed from the first point p1 to the second point p2, and may operate as a second antenna having the second electric length of the second area a2 formed from the first point p1 to the second point p2.

Referring to FIG. 8B, the first antenna may operate in a frequency band of a first radiation path loop 1 having the first electric length corresponding to the first area a1 of the conductive member 310. The second antenna may operate in a frequency band by a second radiation path loop 2 having the second electric length corresponding to the second area a2 of the conductive member 310. For example, the first antenna may be formed to operate in a low band (for example, about 700 MHz to about 900 MHz) by using the first radiation path loop 1, and the second antenna may be formed to operate in a mid band (for example, about 1700 MHz to about 2100 MHz) by using the second radiation path loop 2.

According to an embodiment, the conductive pattern 340 may be positioned in a low band loop, for example, a first loop, to prevent interference by the mid band (second loop).

According to an embodiment, the first antenna has the third conductive layer 350 disposed between the first area a1 of the conductive member 310 and the conductive pattern 340 to be coupled therewith, such that a resonant frequency is shifted to a low band.

Figure 9:
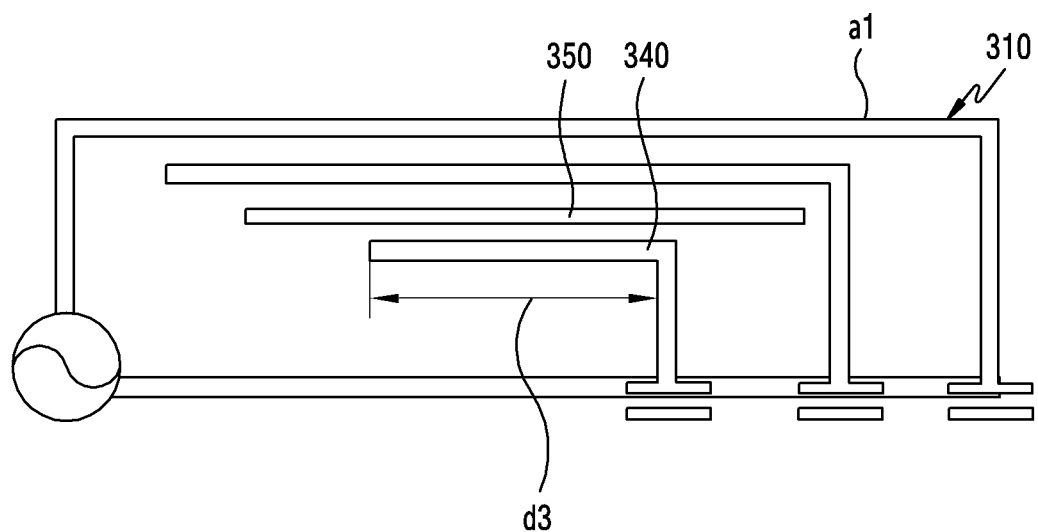
FIG. 9 is a view schematically illustrating an arrangement state of a conductive pattern according to various embodiments of the disclosure.

FIG. 9 is a view schematically illustrating an arrangement state of a conductive pattern according to various embodiments of the disclosure.

Referring to FIG. 9, the first antenna having the first area a1 of the conductive member 310 operating as a radiator according to various embodiments may adjust an electric coupling amount between the third conductive layer 350 and the conductive pattern 340, thereby tuning a low band frequency. For example, the electric coupling amount may be tuned by using one or more of a length, a thickness, or an area of the conductive pattern 340. For example, when the length of the conductive pattern 340 increases, capacitance may increase and an operating frequency band may be shifted.

Figure 10:
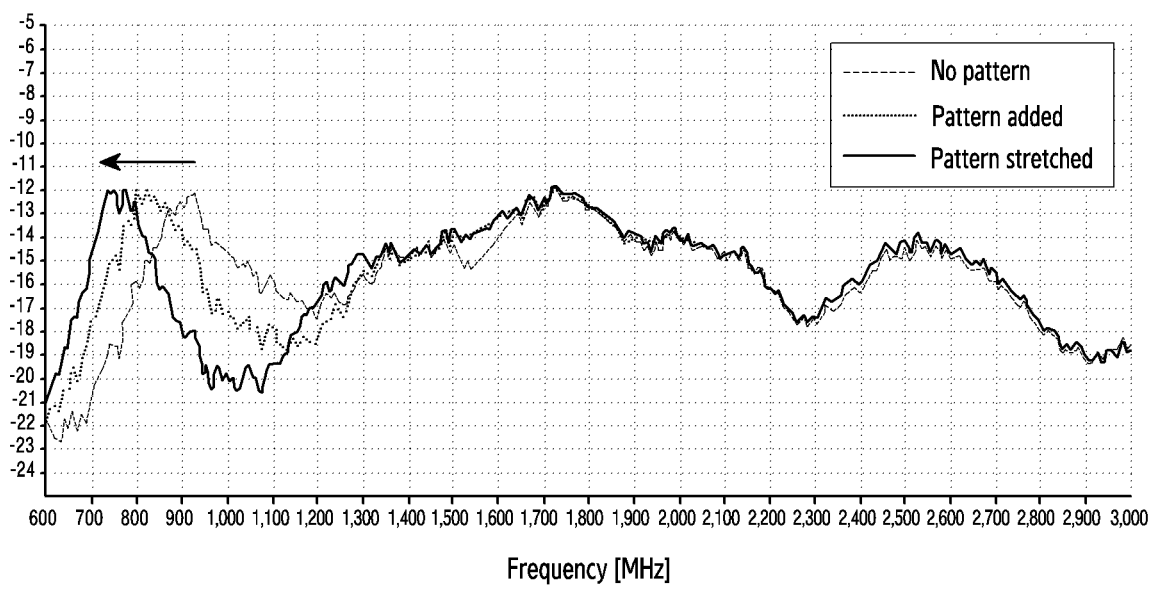
FIG. 10 is a graph illustrating a state in which an operating frequency is shifted according to the presence or absence or stretching of a conductive pattern in an electronic device including an antenna according to various embodiments of the disclosure.

FIG. 10 is a graph illustrating a state in which an operating frequency is shifted according to the presence or absence of a conductive pattern, or stretching thereof in an electronic device including an antenna according to various embodiments of the disclosure.

Referring to FIG. 10, when the third conductive layer 350 according to various embodiments is disposed between the first area a1 of the conductive member 310 and the conductive pattern 340, and is disposed to be electrically coupled with the conductive pattern 340, and, when the conductive member 310 and the wireless communication circuit are electrically connected with each other, an operating frequency band may be different due to a difference in the coupling amount between the third conductive layer 350 and the conductive pattern 340.

For example, when there is no conductive pattern 340, the first antenna may operate in a band of about 900 MHz, and, when the conductive pattern 340 is added, the first antenna may operate in a band of about 800 MHz. When the length of the conductive pattern 340 increases, the first antenna may operate in a band of about 700 MHz. According to increase of the length of the conductive pattern 340, the frequency band of the operating first antenna may be shifted to a low band as indicated by the arrow. It can be seen that, when the length of the conductive pattern 340 increases, the frequency band of the first antenna is reduced by about 200 MHz in comparison to the case where there is no conductive pattern 340.

Figure 11:
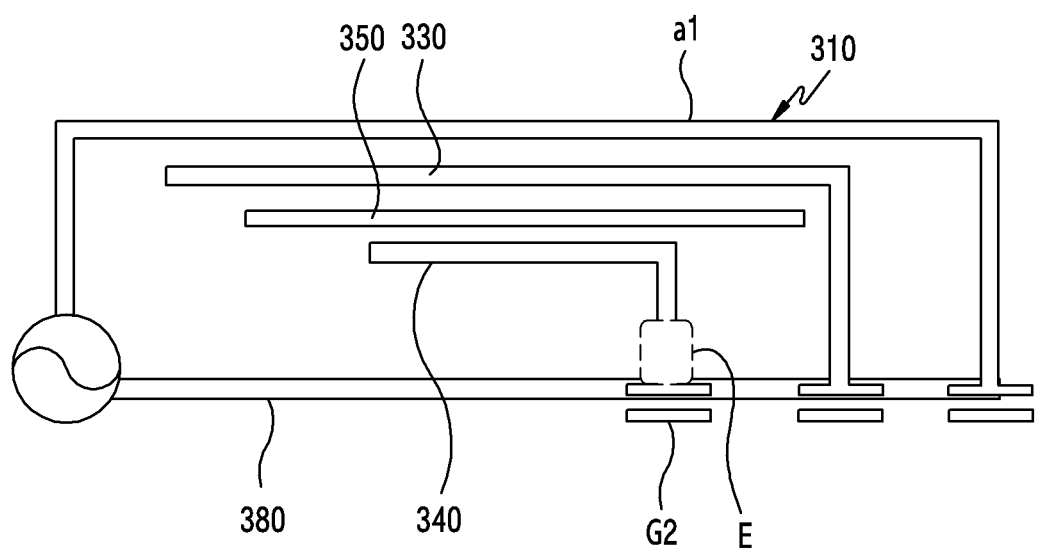
FIG. 11 is a view illustrating a configuration in which a lumped element is added at a connection point with a ground plane of a conductive pattern according to various embodiments of the disclosure.

FIG. 11 is a view illustrating a configuration in which a lumped element is added to a connection point with a second conductive layer G2 (second ground point) of the conductive pattern 340 according to various embodiments of the disclosure.

Referring to FIG. 11, the conductive pattern 340 according to various embodiments may tune a frequency band of the first area a1 of the conductive member 310 by adding a lumped element E added to a connection portion of a second conductive layer (for example, the second conductive layer 381 of FIG. 4A) disposed on the printed circuit board 380. For example, the lumped element E may include R, L, C elements. The lumped element E may be added to the printed circuit board 380 by soldering, etc.

Figure 12:
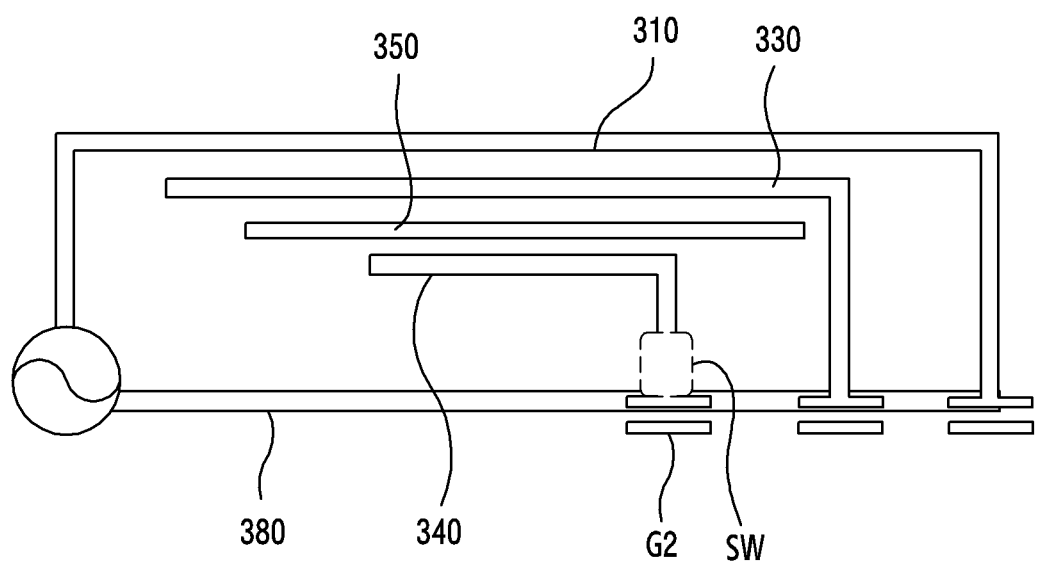
FIG. 12 is a view illustrating a configuration in which a switching circuit unit is added at a connection point with a ground plane of a conductive pattern according to various embodiments of the disclosure.

FIG. 12 is a view illustrating a configuration in which a switching circuit unit is added to a connection point with the second conductive layer of the conductive pattern according to various embodiments of the disclosure.

Referring to FIG. 12, the conductive pattern 340 according to various embodiments may have a switching circuit unit sw added to a connection portion of a second conductive layer G2 disposed on the printed circuit board 380, so that a tunable antenna can be configured in a first area (for example, the first area a1 shown in FIG. 1) of the conductive member 310.

FIGS. 13A to 13D are views illustrating various connection states of a conductive pattern according to an operation of a switching circuit unit according to various embodiments of the disclosure.

Figure 13A:
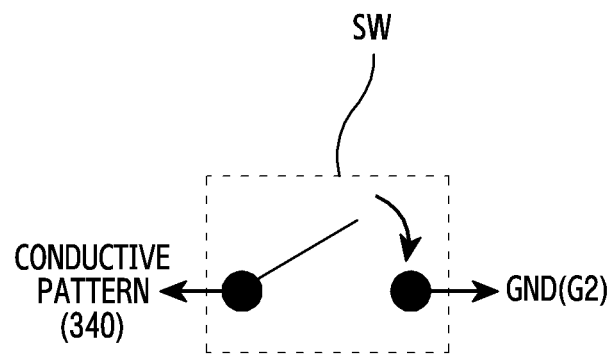
FIGS. 13A to 13B are views illustrating various connection states of a conductive pattern according to an operation of a switching circuit unit according to various embodiments of the disclosure.

Referring to FIG. 13A, the conductive pattern 340 according to various embodiments may be connected with or may not be connected with a second conductive layer (for example, the second conductive layer 381 shown in FIG. 4A) according to a switching operation of the switching circuit unit (for example, the switching circuit unit sw shown in FIG. 12).

Figure 13B:
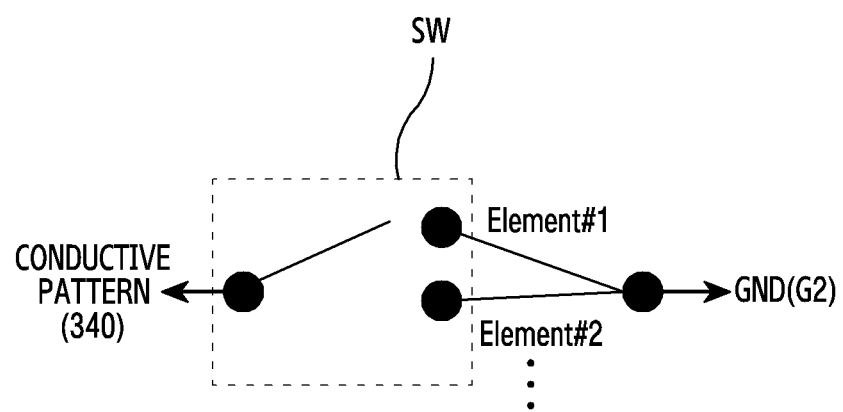

Referring to FIG. 13B, the conductive pattern 340 according to various embodiments may be connected to a second conductive layer (for example, the second conductive layer 381 shown in FIG. 4A) while being connected to one lumped element selected from a plurality of lumped elements (for example, the lumped element E shown in FIG. 11) by a switching operation of the switching circuit unit (for example, the switching circuit unit sw shown in FIG. 12).

Figure 13C:
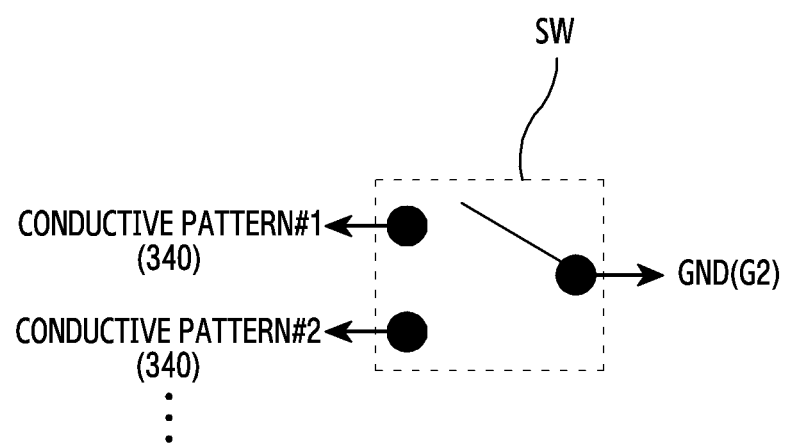

Referring to FIG. 13C, one conductive pattern 340 selected from a plurality of conductive patterns 340 by a switching operation of the switching circuit unit (for example, the switching circuit unit sw shown in FIG. 12) may be connected to a second conductive layer (for example, the second conductive layer 381 shown in FIG. 4A).

Figure 13D:
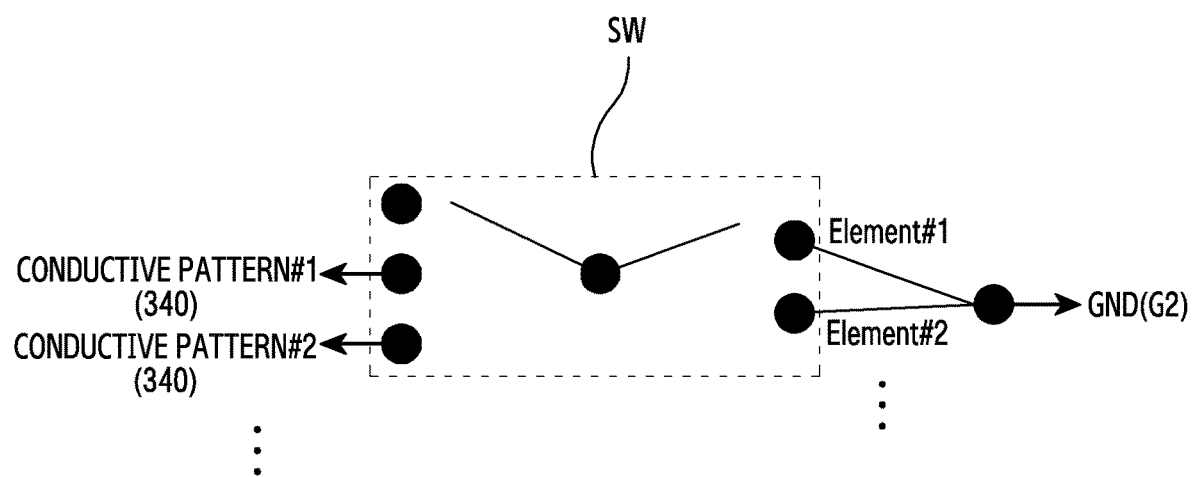

Referring to FIG. 13D, one selected conductive pattern 340 may be connected to a second conductive layer (for example, the second conductive layer 381 shown in FIG. 4A) while being connected to another selected lumped element by a switching operation of the switching circuit unit (for example, the switching circuit unit sw shown in FIG. 12) which is disposed between a plurality of conductive patterns (for example, the conductive pattern 340 of FIG. 4A) and a plurality of lumped elements (for example, the lumped element E shown in FIG. 11) connected to the second conductive layer (for example, the second conductive layer 381 shown in FIG. 4A) of the printed circuit board (for example, the printed circuit board 380 of FIG. 4A).

According to an embodiment of the disclosure, an electronic device (for example, the electronic device 101 shown in FIG. 1 or the electronic device 200 shown in FIG. 2A) may include: a housing (for example, the housing 210 shown in FIG. 2A) including a first surface (for example, the first surface 210A shown in FIG. 2A), a second surface (for example, the second surface 210B shown in FIG. 2B) facing in the opposite direction of the first surface, and a side surface (for example, the side surface member 206 shown in FIG. 2A) surrounding a space between the first surface and the second surface; a conductive member (for example, the conductive member 310 shown in FIG. 3A) forming at least a portion of the side surface; a display (for example, the display 330 shown in FIG. 3A) seen through the first surface and including a first conductive layer (for example, the first conductive layer 332 shown in FIG. 3B); a printed circuit board (for example, the printed circuit board 380 shown in FIG. 4A) disposed to be spaced apart from the display between the display and the second surface within the housing, the printed circuit board including a second conductive layer (for example, the second conductive layer 381 shown in FIG. 4A) facing the first conductive layer at least in part; a third conductive layer (for example, the third conductive layer 350 shown in FIG. 3A) spaced apart from the display and the printed circuit board, disposed between the first conductive layer and the second conductive layer, and facing the first conductive layer; a support structure (for example, the support structure 360 shown in FIG. 6) contacting the third conductive layer at least in part, and including a non-conductive plate (for example, the non-conductive plate 361 shown in FIG. 5A) formed between the third conductive layer and the printed circuit board; a conductive pattern (for example, the conductive pattern 430 shown in FIG. 4A) extended between the third conductive layer and the non-conductive plate and electrically connected with the second conductive layer; and a wireless communication circuit (for example, the wireless communication module 192 shown in FIG. 1) electrically connected with the conductive member and configured to transmit and/or receive an RF signal.

According to an embodiment of the disclosure, the third conductive layer (for example, the third conductive layer 350 shown in FIG. 3A) and the conductive pattern (for example, the conductive pattern 340 shown in FIG. 4A) may be electrically separated from each other.

According to an embodiment of the disclosure, the electronic device may further include at least one non-conductive member (for example, the second insulation layer 354 shown in FIG. 6) disposed between the conductive pattern (for example, the conductive pattern 340 shown in FIG. 4A) and the third conductive layer (for example, the third conductive layer 350 shown in FIG. 3A), and the non-conductive member may include an insulation layer formed on one surface of the third conductive layer (for example, the third conductive layer 350 shown in FIG. 3A) and/or an insulation layer formed on one surface of the conductive pattern (for example, the conductive pattern 340 shown in FIG. 4A).

According to an embodiment of the disclosure, the conductive pattern (for example, the conductive pattern 340 shown in FIG. 4A) may include any one pattern from among patterns disposed on the non-conductive plate of the support structure (for example, the support structure 360 shown in FIG. 3A) in the form of laser direct structuring (LDS), thin film antenna (TFA), flexible printed circuit board (FPCB), or steel use stainless (SUS).

According to an embodiment of the disclosure, the conductive pattern (for example, the conductive pattern 340 shown in FIG. 4A) may further include an extension portion (for example, the extension portion 342 shown in FIG. 4A) disposed on a side surface of the support structure (for example, the support structure 360 shown in FIG. 3A) to electrically connect to the second conductive layer (for example, the second conductive layer 381 shown in FIG. 4A) of the printed circuit board.

According to an embodiment of the disclosure, the third conductive layer (for example, the third conductive layer 350 shown in FIG. 3A) may be disposed in a floating state to be spaced apart from an inner surface of the conductive member (for example, the conductive member 310 shown in FIG. 3A).

According to an embodiment of the disclosure, an operating frequency band of the conductive member (for example, the conductive member 310 shown in FIG. 3A) may be tuned by adjusting an electric coupling amount between the third conductive layer (for example, the third conductive layer 350 shown in FIG. 3A) and the conductive pattern by one or more of a length, an area, or a thickness of the conductive pattern (for example, the conductive pattern 340 shown in FIG. 4A).

According to an embodiment of the disclosure, the third conductive layer (for example, the third conductive layer 350 shown in FIG. 3A) may further include an opening (for example, the opening 353 shown in FIG. 5C) formed on a center area thereof.

According to an embodiment of the disclosure, an electronic device (for example, the electronic device 101 shown in FIG. 1 or the electronic device 200 shown in FIG. 2A) may include: a housing (for example, the housing 210 shown in FIG. 2A) including a first plate (for example, the first plate 201 shown in FIG. 2A), a second plate (for example, the second plate 207 shown in FIG. 2B) facing in the opposite direction of the first plate, and a side surface member (for example, the side surface member 206 shown in FIG. 2A) surrounding a space between the first and second plates, the side surface member including an annular conductive member; a display (for example, the display 330 shown in FIG. 3A) disposed between the first and second plates; a printed circuit board (for example, the printed circuit board 380 shown in FIG. 4A) disposed in the space in parallel with the display, and including a ground plane (for example, the second conductive layer 381 shown in FIG. 4A); a support structure (for example, the support structure 360 shown in FIG. 3A) disposed between the display and the printed circuit board; at least one wireless communication circuit (for example, the wireless communication module 192 shown in FIG. 1) disposed on the printed circuit board; a first conductive connection member (for example, the first conductive connection member 351 shown in FIG. 3B) configured to connect the wireless communication circuit and the annular conductive member; a second conductive connection member (for example, the second conductive connection member 352 shown in FIG. 3B) configured to connect the ground plane and the annular conductive member; a conductive layer (for example, the third conductive layer 350 shown in FIG. 3A) disposed to be spaced apart from the display and the support structure therebetween; and a conductive pattern (for example, the conductive pattern 340 shown in FIG. 4A) disposed to be spaced apart from the conductive layer, disposed on a position to be electrically coupled with the conductive layer, and grounded to the ground plane of the printed circuit board.

According to an embodiment of the disclosure, the support structure (for example, the support structure 360 shown in FIG. 3A) may include: a first surface (for example, the first surface 360a shown in FIG. 4A) facing the display; a second surface (for example, the second surface 360b shown in FIG. 4A) facing the printed circuit board in the opposite direction of the first surface; and a side surface (for example, the side surface 360c shown in FIG. 5A) surrounding at least a portion of a space between the first and second surfaces, and the conductive pattern (for example, the conductive pattern 340 shown in FIG. 4A) may be disposed on the first surface of the support structure.

According to an embodiment, the conductive layer (for example, the third conductive layer 350 shown in FIG. 3A) may include a first surface (for example, the first surface 350a shown in FIG. 6) facing the display (for example, the display 330 shown in FIG. 3A), and a second surface (for example, the second surface 350b shown in FIG. 6) facing the support structure (for example, the support structure 360 shown in FIG. 3A) in the opposite direction of the first surface, the first surface of the conductive layer may face the display while being spaced apart therefrom, and the second surface may face the support structure (for example, the support structure 360 shown in FIG. 3A) while being spaced apart therefrom, and a first insulation layer (for example, the first insulation layer 355 shown in FIG. 6) may be coated over the first surface of the conductive layer (for example, the third conductive layer 350 shown in FIG. 3A), and a second insulation layer (for example, the second insulation layer 354 shown in FIG. 6) may be coated over the second surface of the conductive layer.

According to an embodiment of the disclosure, the annular conductive may include a first area (for example, the first area a1 shown in FIG. 8A) having a first length (for example, the first length l1 shown in FIG. 8A), and a second area (for example, the second area a2 shown in FIG. 8A) having a second length (for example, the second length l2 shown in FIG. 8A) shorter than the first length, and the first area (for example, the first area a1 shown in FIG. 8A) of the annular conductive member (for example, the conductive member 310 shown in FIG. 3A) may operate as a first antenna having a first frequency range from about 700 MHz to about 900 MHz, and the second area (for example, the second area a2 shown in FIG. 8A) of the annular conductive member may operate as a second antenna having a second frequency range from about 1700 MHz to about 2100 MHz.

According to an embodiment of the disclosure, the conductive pattern (for example, the conductive pattern 340 shown in FIG. 4A) may be connected to the ground plane (for example, the second conductive layer 381 shown in FIG. 4A) of the printed circuit board corresponding to the first area (for example, the first area a1 shown in FIG. 8A) of the annular conductive member.

According to an embodiment of the disclosure, at least a portion of the conductive layer (for example, the conductive layer 350 shown in FIG. 3A) may overlap the conductive pattern when viewed above the first plate.

According to an embodiment of the disclosure, the conductive layer (for example, the third conductive layer 350 shown in FIG. 3A) may be disposed in a floating state to be spaced apart from the annular conductive member (for example, the conductive member 310 shown in FIG. 3A) and the conductive pattern (for example, the conductive pattern 340 shown in FIG. 4A), respectively.

The invention claimed is:

1. An electronic device comprising:
   a housing comprising a first surface, a second surface facing in the opposite direction of the first surface, and a side surface surrounding a space between the first surface and the second surface;
   a conductive member forming at least a portion of the side surface;
   a display seen through the first surface and comprising a first conductive layer;
   a printed circuit board disposed to be spaced apart from the display between the display and the second surface within the housing, the printed circuit board comprising a second conductive layer facing the first conductive layer at least in part;
   a third conductive layer spaced apart from the display and the printed circuit board, disposed between the first conductive layer and the second conductive layer, and facing the first conductive layer;
   a support structure contacting the third conductive layer at least in part, and comprising a non-conductive plate formed between the third conductive layer and the printed circuit board;
   a conductive pattern extended between the third conductive layer and the non-conductive plate and electrically connected with the second conductive layer; and
   a wireless communication circuit electrically connected with the conductive member and configured to transmit and/or receive an RF signal.

2. The electronic device of claim 1, wherein the third conductive layer and the conductive pattern are electrically separated from each other.

3. The electronic device of claim 2, further comprising at least one non-conductive member disposed between the conductive pattern and the third conductive layer,
   wherein the non-conductive member comprises an insulation layer formed on one surface of the third conductive layer and/or an insulation layer formed on one surface of the conductive pattern.

4. The electronic device of claim 1, wherein the conductive pattern comprises any one pattern from among patterns disposed on the non-conductive plate of the support structure in the form of laser direct structuring (LDS), thin film antenna (TFA), flexible printed circuit board (FPCB), or steel use stainless (SUS).

5. The electronic device of claim 1, wherein the conductive pattern further comprises an extension portion disposed on a side surface of the support structure to electrically connect to the second conductive layer of the printed circuit board.

6. The electronic device of claim 1, wherein the third conductive layer is disposed in a floating state to be spaced apart from an inner surface of the conductive member.

7. The electronic device of claim 1, wherein an operating frequency band of the conductive member is tuned by adjusting an electric coupling amount between the third conductive layer and the conductive pattern by one or more of a length, an area, or a thickness of the conductive pattern.

8. The electronic device of claim 1, wherein the third conductive layer further comprises an opening formed on a center area thereof.

9. An electronic device comprising:
   a housing comprising a first plate, a second plate facing in the opposite direction of the first plate, and a side surface member surrounding a space between the first and second plates, the side surface member comprising an annular conductive member;
   a display disposed between the first and second plates;
   a printed circuit board disposed in the space in parallel with the display, and comprising a ground plane;
   a support structure disposed between the display and the printed circuit board;
   at least one wireless communication circuit disposed on the printed circuit board;
   a first conductive connection member configured to connect the wireless communication circuit and the annular conductive member;
   a second conductive connection member configured to connect the ground plane and the annular conductive member;
   a conductive layer disposed to be spaced apart from the display and the support structure therebetween; and
   a conductive pattern disposed to be spaced apart from the conductive layer, disposed on a position to be electrically coupled with the conductive layer, and grounded to the ground plane.

10. The electronic device of claim 9, wherein the support structure comprises:
    a first surface facing the display;
    a second surface facing the printed circuit board in the opposite direction of the first surface; and
    a side surface surrounding at least a portion of a space between the first and second surfaces, and
    wherein the conductive pattern is disposed on the first surface of the support structure.

11. The electronic device of claim 9, wherein the conductive layer comprises a first surface facing the display, and a second surface facing the support structure in the opposite direction of the first surface, wherein the first surface of the conductive layer faces the display while being spaced apart therefrom, wherein the second surface faces the support structure while being spaced apart therefrom, and wherein a first insulation layer is coated over the first surface of the conductive layer, and a second insulation layer is coated over the second surface of the conductive layer.

12. The electronic device of claim 9, wherein the annular conductive member comprises a first area having a first length, and a second area having a second length shorter than the first length, and wherein the first area operates as a first antenna having a first frequency range from about 700 MHz to about 900 MHz, and the second area operates as a second antenna having a second frequency range from about 1700 MHz to about 2100 MHz.

13. The electronic device of claim 12, wherein the conductive pattern is connected to the ground plane adjacent to the first area.

14. The electronic device of claim 9, wherein at least a portion of the conductive layer overlaps the conductive pattern when viewed above the first plate.

15. The electronic device of claim 9, wherein the conductive layer is disposed in a floating state to be spaced apart from the annular conductive member and the conductive pattern, respectively.

* * * * *